United States Patent [19]
Noro et al.

[11] Patent Number: 5,757,299
[45] Date of Patent: May 26, 1998

[54] ANALOG-DIGITAL CONVERTER USING DELTA SIGMA MODULATION DIGITAL FILTERING, AND GAIN-SCALING

[75] Inventors: Masao Noro; Yusuke Yamamoto; Toshio Maejima, all of Hamamatsu, Japan

[73] Assignee: Yamaha Corporation

[21] Appl. No.: 533,764

[22] Filed: Sep. 26, 1995

[30] Foreign Application Priority Data

Sep. 30, 1994 [JP] Japan .................. 6-261927
Oct. 25, 1994 [JP] Japan .................. 6-284140

[51] Int. Cl.⁶ .................................. H03M 3/02
[52] U.S. Cl. .......................... 341/143; 341/172
[58] Field of Search ............... 341/143, 161, 341/162, 172

[56] References Cited

U.S. PATENT DOCUMENTS

| | | |
|---|---|---|
| 4,851,841 | 7/1989 | Sooch . |
| 4,972,436 | 11/1990 | Halim et al. ............ 375/28 |
| 5,055,843 | 10/1991 | Ferguson, Jr. et al. .......... 341/143 |
| 5,068,680 | 11/1991 | Swanson et al. ........... 341/143 |
| 5,079,550 | 1/1992 | Sooch et al. ............ 341/143 |
| 5,187,482 | 2/1993 | Tiemann et al. . |
| 5,283,578 | 2/1994 | Ribner et al. ........... 341/143 |
| 5,311,181 | 5/1994 | Ferguson, Jr. et al. ........ 341/143 |
| 5,392,043 | 2/1995 | Ribner ................ 341/143 |

FOREIGN PATENT DOCUMENTS 0 577 902 A1  1/1994  European Pat. Off. .

WO 92/05739  4/1992  WIPO .

*Primary Examiner*—Marc S. Hoff
*Attorney, Agent, or Firm*—Graham & James LLP

[57] ABSTRACT

An analog-digital converter comprises a $\Delta\Sigma$ modulator, a digital filter, a high-pass filter and a multiplier which are connected in series. Analog input is converted into serial-bit strings by the $\Delta\Sigma$ modulator, for which gain '1/A' is set. The digital filter extracts low-frequency components, corresponding to the analog input, from the serial-bit strings, so the low-frequency components are converted into parallel-bit digital data. The high-pass filter removes DC offset component from output of the digital filter; and then, output thereof is multiplied by scaling gain 'A' by the multiplier so that digital output is produced. The $\Delta\Sigma$ modulator comprises at least three switched-capacitor integrators and a one-bit quantizer, which are connected in series, as well as a one-sample delay circuit. One-bit output, produced by the one-bit quantizer, is delayed by the one-sample delay circuit, whose output is delivered to each switched-capacitor integrator. Each switched-capacitor integrator is configured using a CMOS differential amplifier which is configured by a CMOS operational amplifier and at least one amplitude-limiting circuit. The amplitude-limiting circuit is configured by two PMOS transistors and two NMOS transistors which are connected in parallel in a diode-connection manner; and this circuit is provided to limit amplitude in output of the CMOS differential amplifier by stabilizing its operating point.

7 Claims, 13 Drawing Sheets

FIG.2
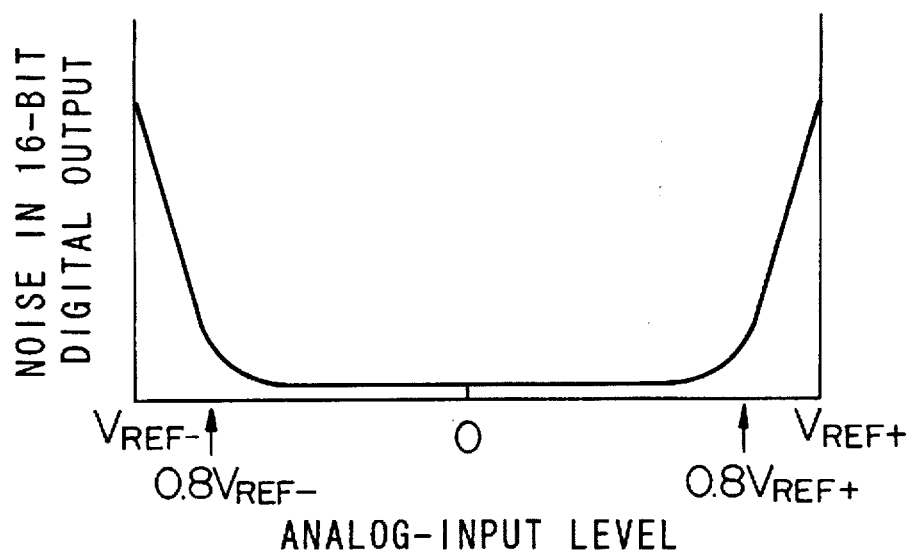
FIG.3A
(ANALOG-INPUT SIGNAL)
FIG.3B
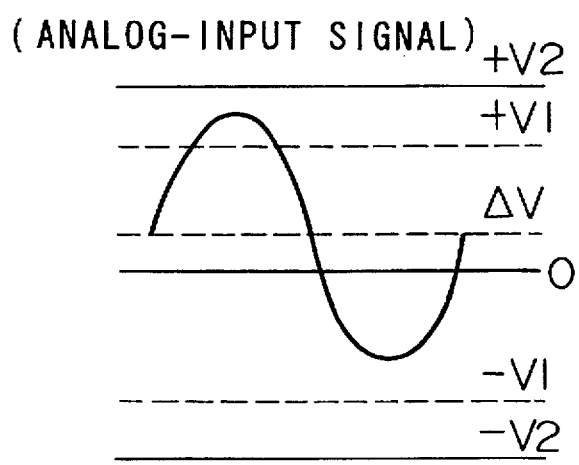
(OUTPUT OF HPF)

ANALOG INPUT

OUTPUT OF HIGH-PASS FILTER 16

OUTPUT OF MULTIPLIER 17

5,757,299

ANALOG-DIGITAL CONVERTER USING DELTA SIGMA MODULATION DIGITAL FILTERING, AND GAIN-SCALING

BACKGROUND OF THE INVENTION

1. Field of the Invention

The present invention relates to analog-digital converters using Δ Σ modulation.

2. Prior Art

Conventionally, there are provided one-bit analog-digital converters which use Δ Σ modulation system. FIG. 1 shows an example of a Δ Σ analog-digital converter conventionally known. In FIG. 1, a Δ Σ modulator 31 converts an analog input into serial-bit strings. This Δ Σ modulator 31 consists of a switched-capacitor integrator 32, a one-bit quantizer 33 and a feedback circuit 34. Herein, the one-bit quantizer 33, which is configured using a clocked comparator, is provided to quantize an output of the switched-capacitor integrator 32; and an output of the one-bit quantizer 33 is subjected to one-sample delay in the feedback circuit 34 based on reference voltage, wherein either positive reference voltage $V_{REF+}$ or negative reference voltage $V_{REF-}$ is selected as the reference voltage in response to polarity of the output of the one-bit quantizer 33. Serial-bit strings, which are produced by the Δ Σ modulator 31, are inputted into a digital filter 35. The digital filter 35 extracts low-frequency components, corresponding to the analog input, from the serial-bit strings, so the low-frequency components extracted are converted into digital data of certain number of bits.

The above-mentioned analog-digital converter employs a so-called "scaling system" (disclosed by U.S. Pat. No. 4,851,841) in order to reduce noise in a digital output. According to the scaling system, gain of the Δ Σ modulator 31 is fixed at '1/A', while scaling gain 'A' is provided for the digital filter 35 by using impulse-response coefficients. Such a system is made under consideration of a fact that the analog-digital converter of FIG. 1 has certain noise characteristic, as shown by FIG. 2, with respect to analog-input level.

In the analog-digital converter of FIG. 1, as shown by FIG. 2, as the analog input becomes closer to full scale in analog-input level, i.e., "clip level" of the Δ Σ modulator 31, level of noise in the digital output becomes larger, wherein the clip level of the Δ Σ modulator 31 is set at either $V_{REF+}$ or $V_{REF-}$. Therefore, the gain of the Δ Σ modulator 31 is suppressed in such a way that maximum value in the analog input coincides with the reference voltage multiplied by '1/A' (e.g., '0.8'). In contrast to suppression of the gain of the Δ Σ modulator 31, scaling gain 'A' is applied to the digital filter 35 which follows the Δ Σ modulator 31. By employing such a scaling system, it is possible to effectively reduce the noise.

Meanwhile, if the analog input contains DC offset component, "calibration" is required to remove the DC offset component at last. In order to do so, the digital filter 35 is followed by a high-pass filter, for example. However, when providing the high-pass filter which follows the digital filter 35 under a condition where a certain gain is applied to the digital filter by employing the aforementioned scaling system, some problem occurs due to clipping for high-level signals.

Now, we will explain about the aforementioned problem with reference to FIGS. 3A and 3B. Let us think about it by using an analog-input signal, whose amplitude is relatively large and which contains a DC offset 'Δ V', as shown by FIG. 3A, for example. Herein, '±V1' indicate clip levels of the digital filter 35; and '±V2' indicates clip levels of the Δ Σ modulator 31. The above-mentioned clip levels ±V1 and ±V2 are shown relatively with respect to altering level of the analog-input signal, so relationship between clip levels, which are actually set for the analog-digital converter of FIG. 1, do not necessarily coincide with relationship between ±V1 and ±V2 shown by FIG. 3A. Thanks to the aforementioned scaling system, maximum amplitude of the analog-input signal can be suppressed less than the clip level of the Δ Σ modulator 31. On the other hand, the scaling gain A is applied to the digital filter 35, so the clip level becomes lower. If the DC offset Δ exists in a positive side of the analog-input signal shown by FIG. 3A, there may occur a situation where waveform in the positive side of the analog-input signal (i.e., a positive part of the output of the high-pass filter) is clipped at a certain level as shown by FIG. 3B. In that situation, the DC offset can be removed, however, a clipped state in positive side of the waveform may remain in an output of the high-pass filter. Such a clipped state may cause to occur deformation corresponding to overflow of data.

As described above, in order to reduce the noise, the scaling system is applied to the analog-digital converter, based on the Δ Σ modulation, so that gain of the modulator is limited while a certain gain is applied to the digital filter which follows the modulator. In this case, if DC offset is contained by the analog-input signal, a clipped state may occur in large amplitude of the analog-input signal. So, there is a problem that un-desired effect due to such a clipped state cannot be eliminated even if a high-pass filter is provided to remove the DC offset.

SUMMARY OF THE INVENTION

It is an object of the present invention to provide an analog-digital converter, using Δ Σ modulation system, which is capable of effectively reducing noise while eliminating effect due to occurrence of a clipped state in an analog-input signal.

It is another object of the present invention to provide a Δ Σ modulator, applicable to the analog-digital converter, which uses a CMOS differential amplifier and whose operation is stabilized by effectively suppressing variation in operating point of the CMOS differential amplifier.

According to fundamental configuration of the present invention, an analog-digital converter comprises a Δ Σ modulator, a digital filter, a high-pass filter and a multiplier which are connected in series. Analog input is converted into serial-bit strings by the Δ Σ modulator, for which gain '1/A' is set. Herein, 'A' is set to 1 or more; preferably, 'A' is set within 1.3 to 2; further, 'A' can be set to a multiple number of 2 for the simplicity of design. The digital filter extracts low-frequency components, corresponding to the analog input, from the serial-bit strings, so the low-frequency components are converted into parallel-bit digital data. The high-pass filter removes DC offset component from output of the digital filter; and then, output thereof is multiplied by scaling gain 'A' by the multiplier so that digital output is produced. Since the scaling is performed by the multiplier after the high-pass filter which is provided to remove the DC offset component, the analog-digital converter can effectively achieve removal of the DC offset component as well as reduction of noise.

Further, the Δ Σ modulator comprises at least three switched-capacitor integrators, a one-bit quantizer and a one-sample delay circuit. Herein, original input is applied to a first switched-capacitor integrator, while output of a last switched-capacitor integrator is subjected to quantization by the one-bit quantizer so that one-bit output is produced. The one-bit output is delayed by the one-sample delay circuit, whose output is delivered to each switched-capacitor integrator. Each switched-capacitor integrator is configured using a CMOS differential amplifier which is configured by a CMOS operational amplifier and at least one amplitude-limiting circuit which are connected in parallel. The amplitude-limiting circuit is configured by two PMOS transistors and two NMOS transistors which are connected in parallel in a diode-connection manner; and it is provided to limit amplitude in output of the CMOS differential amplifier by stabilizing an operating point.

BRIEF DESCRIPTION OF THE DRAWINGS

These and other objects of the subject invention will become more fully apparent as the following description is read in light of the attached drawings wherein:

FIG. 2 is a graph showing noise characteristic of a $\Delta \Sigma$ modulator;

FIGS. 3A and 3B show waveforms which are used to explain a problem which occurs in the conventional analog-digital converter;

DESCRIPTION OF THE PREFERRED EMBODIMENTS

[A] Analog-Digital Converter

Now, an analog-digital converter according to an embodiment of the present invention will be described with reference to FIG. 4 and FIGS. 5A to 5C.

Figure 1:
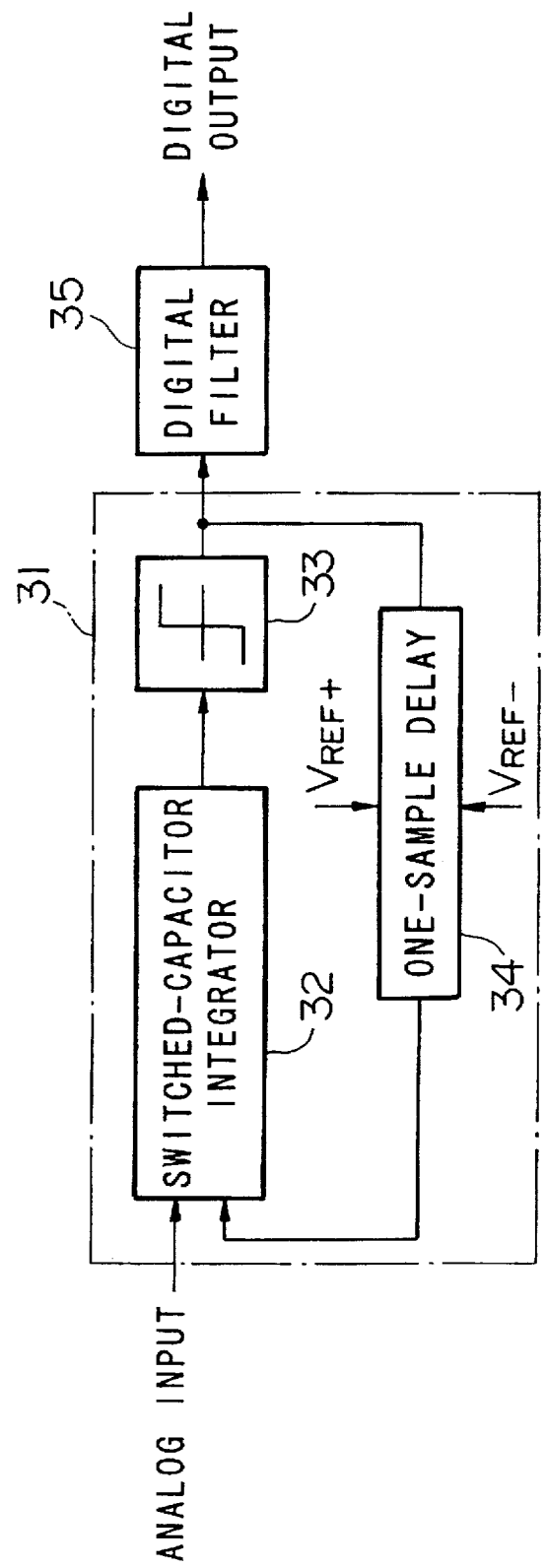
FIG. 1 is a block diagram showing an example of a conventional analog-digital converter.
Figure 4:
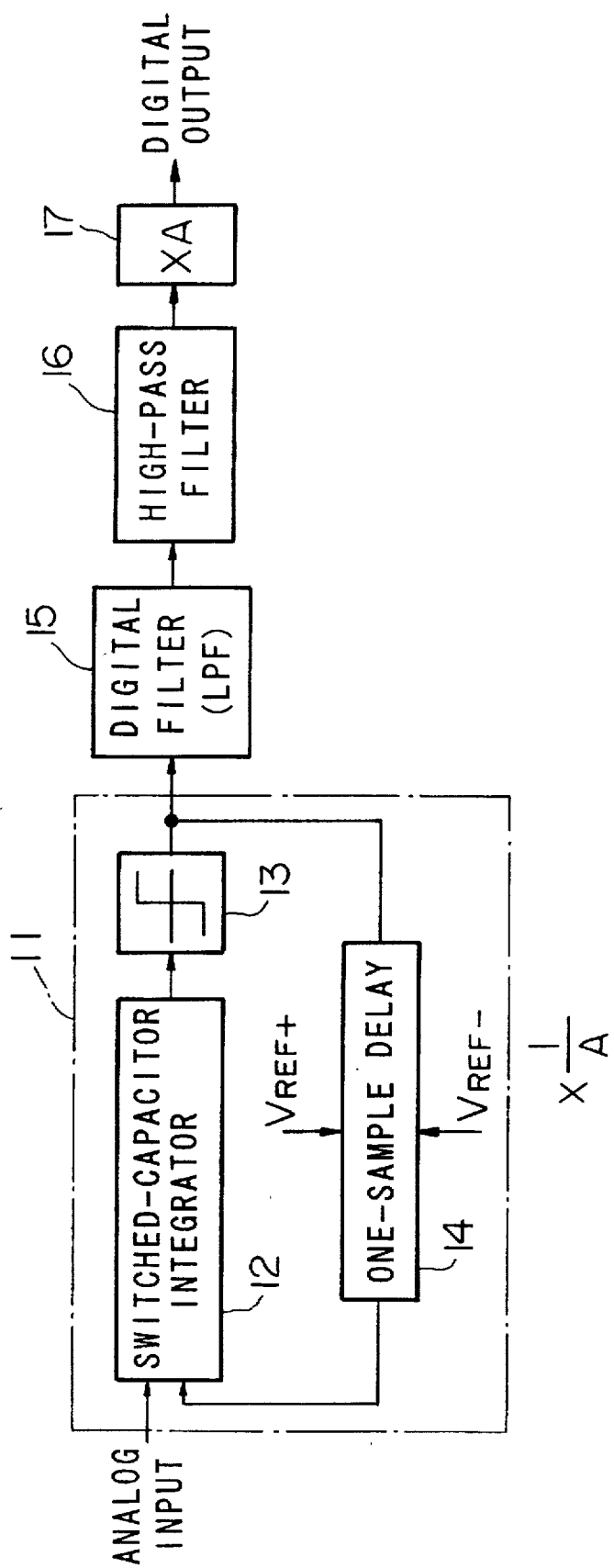
FIG. 4 is a block diagram showing an analog-digital converter according to an embodiment of the present invention.

FIG. 4 shows configuration of the analog-digital converter. Herein, a $\Delta \Sigma$ modulator 11 is configured by a switched-capacitor integrator 12, a one-bit quantizer 13 and a feedback circuit 14. The switched-capacitor integrator 12 receives an analog input; the one-bit quantizer 13, which is configured using a clocked comparator and the like, is provided to quantize an output of the switched-capacitor integrator 12; and the feedback circuit 14 imparts one-sample delay to an output of the one-bit quantizer 13, so an output of the feedback circuit 14 is supplied to the switched-capacitor integrator 12. Fundamental configuration of the $\Delta \Sigma$ modulator 11 in FIG. 4 is similar to that of the aforementioned $\Delta \Sigma$ modulator 31 in FIG. 1. However, the modulator 11 can be modified to a high-order modulator such as a second-order modulator and a third-order modulator.

Incidentally, gain '1/A' is applied to the $\Delta \Sigma$ modulator 11. Specifically, the gain 1/A is set at '0.5', for example.

Serial-bit strings, outputted from the $\Delta \Sigma$ modulator 11, are supplied to a digital filter 15 having function of low-pass filter. The serial-bit strings are converted into digital data of predetermined number of bits by the digital filter 15. An output of the digital filter 15 is supplied to a high-pass filter 16 which is provided for calibration. This high-pass filter 16 is followed by a multiplier 17 which has scaling gain 'A' for the scaling. Specifically, the scaling gain A is set at '2', for example.

Such a configuration, in which the gain of the modulator 11 is suppressed to '1/A' while an output of the high-pass filter 16 is multiplied by the scaling gain 'A' at last, is capable of reducing modulation noise. In contrast to the aforementioned scaling system, no gain is applied to both of the digital filter 15 and the high-pass filter 16 in the present embodiment. So, the present embodiment is advantageous in that even if DC offset component exists in the analog-input signal, no clipped state is caused to occur. Such an advantage of the present embodiment will be described with reference to FIGS. 5A to 5C against FIGS. 3A and 3B.

Figure 5A:
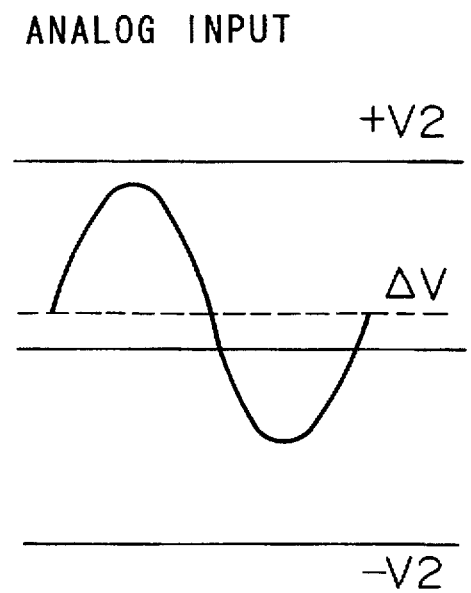
FIGS. 5A to 5C show waveforms which are used to explain effect in noise reduction of the embodiment.
Figure 5B:
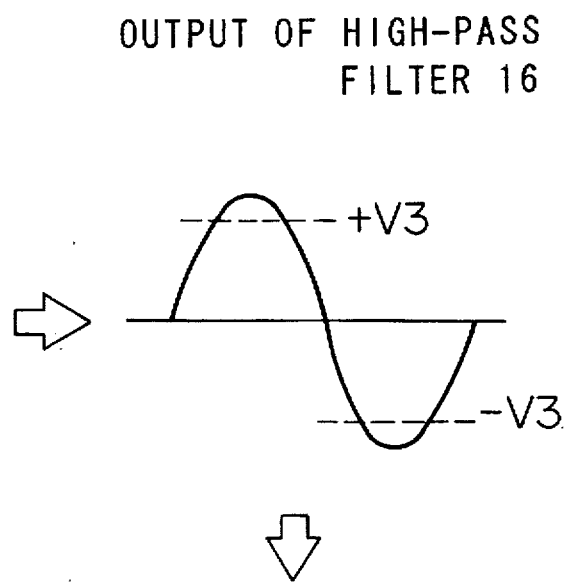
Figure 5C:
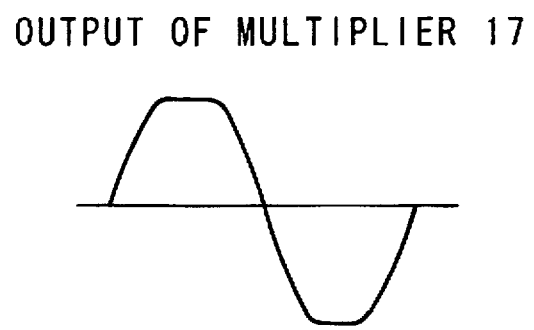

As described above, the present embodiment is designed in such a way that no gain is applied to the digital filter 15 and the high-pass filter 16, clip levels '±V2' of the modulator 11 themselves directly act as clip levels of the digital filter 15 as shown by FIG. 5A. So, even in case of a large-amplitude analog input having DC offset $\Delta$ V, there is no chance that a clipped state occurs in the digital filter 15. Further, even if the DC offset is removed by the high-pass filter 16, no clipped state occurs in the output of the high-pass filter 16 as shown by FIG. 5B.

Further, the multiplier 17 is provided to apply the scaling gain A to the output of the high-pass filter 16 at last. So, even if a clipped state occurs, only small parts in waveform of the output of the high-pass filter 16 may be slightly clipped at clip levels '±V3' because the DC offset has been already removed. Moreover, the clip levels ±V3 are formed symmetrically in positive/negative sides of the waveform, so there is no possibility that a single clip level is formed only in positive side or negative side of the waveform. So, in contrast to the conventional technology in which clipping occurs under a state where the DC offset remains, degree of distortion in waveform, due to the clipping, can be remarkably reduced.

[B] $\Delta \Sigma$ Modulator

Conventionally, $\Delta \Sigma$ modulators are known as $\Delta$ modulators which are provided to obtain noise-shaping effects by concentrating quantization noise at high-frequency ranges. Those $\Delta \Sigma$ modulators are employed for one-bit-type digital-analog converters, which perform re-quantization on digital signals so as to convert them into one-bit digital signals, as well as for analog-digital converters which convert analog signals into digital signals.

The Δ Σ modulator is configured by a switched-capacitor integrator, a one-bit quantizer and a delay circuit, for example. Herein, the switched-capacitor integrator is connected to a signal-input terminal; output of the integrator is quantized by the quantizer, so output of the quantizer is delivered to a signal-output terminal and the delay circuit. The output of the quantizer is subjected to one-sample delay by the delay circuit; and then, it is fed back to the signal-input terminal. The switched-capacitor integrator is configured by a CMOS differential amplifier, using a CMOS operational amplifier, with combination of switch components and capacitors, for example. Basically, the Δ Σ modulator uses only one switched-capacitor integrator. A Δ Σ modulator which provides two switched-capacitor integrators is called a second-order Δ Σ modulator; and a Δ Σ modulator which provides three switched-capacitor integrators is called a third-order Δ Σ modulator.

A high-order Δ Σ modulator, whose number of order is three or more, suffers from a problem as follows:

When output of the CMOS differential amplifier in the switched-capacitor integrator increases up to power-supply level, an input-over event occurs, so a phase delay of a feedback loop in the Δ Σ modulator exceeds 180°. In such an event, an oscillation state occurs in the Δ Σ modulator.

So, it is demanded to provide a CMOS differential amplifier which is capable of effectively suppressing variation in operation point. In addition, it is demanded to provide a Δ Σ modulator whose operation is stabilized by effectively limiting amplitudes in output of the CMOS differential amplifier.

In order to avoid variation in operating point of the CMOS differential amplifier, limitation in output amplitude of the CMOS differential amplifier is required. Such limitation may be achieved by merely providing diodes in feedback circuits of the CMOS differential amplifier. However, results in experiments which the inventor perform indicate that provision of diodes is hard to perfectly suppress variation in operating point of the CMOS differential amplifier. Therefore, special circuit design is required for the CMOS differential amplifier in order to achieve perfect limitation in variation of operating point.

Next, an example of a Δ Σ modulator, which is suitable for use in the present invention, will be described in detail.

Figure 6:
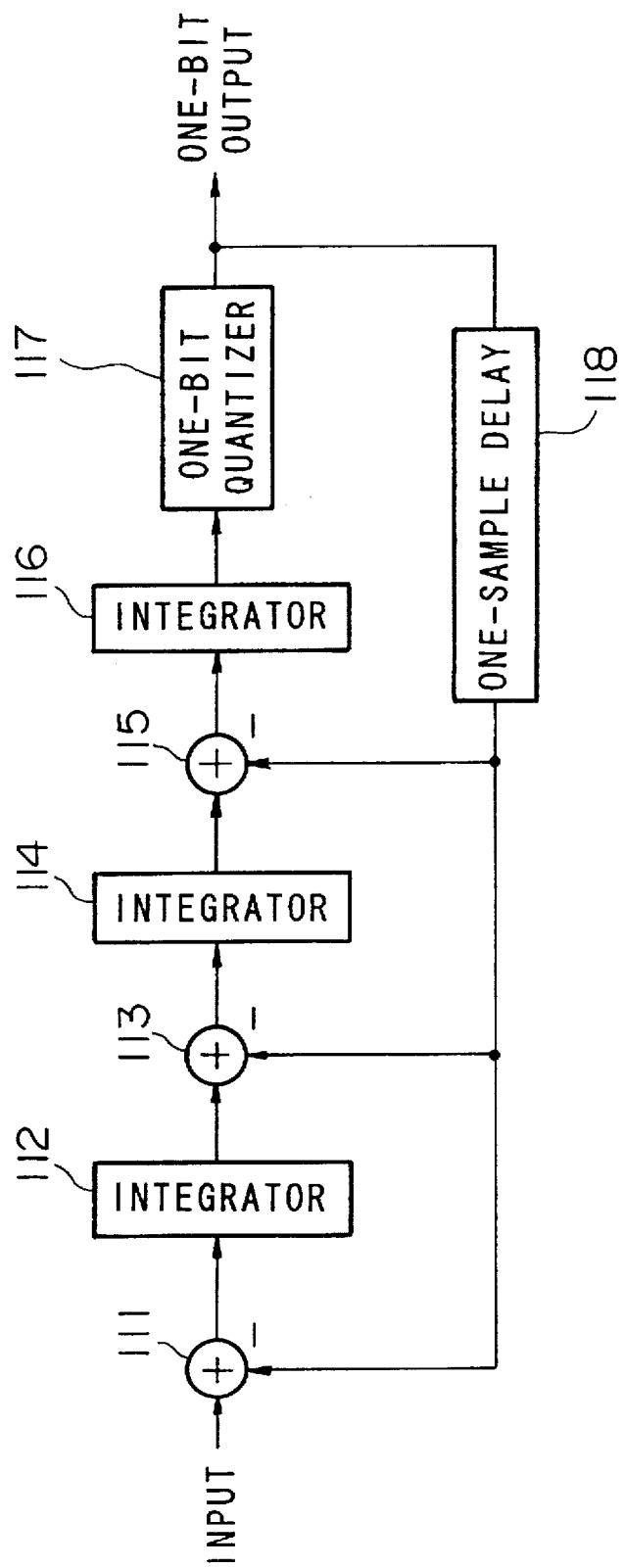
FIG. 6 is a block diagram showing an embodiment of a $\Delta \Sigma$ modulator.

FIG. 6 shows an example in configuration of a third-order Δ Σ modulator. Herein, input data are supplied to an adder 111 which subtracts feedback data, given from a one-sample delay circuit 118, from the input data. So, the adder 111 provides difference between them, which is then supplied to a first-stage integrator 112. The integrator 112 performs integration on it. Similarly, an adder 113 provides difference between output of the integrator 112 and the feedback data, so a second-stage integrator 114 performs integration on it. Further, an adder 115 provides difference between output of the integrator 114 and the feedback data, so a third-stage integrator performs integration on it. Output of the integrator 116 is converted into serial-bit strings by a one-bit quantizer 117 which contains a clocked comparator (not shown).

Figure 7:
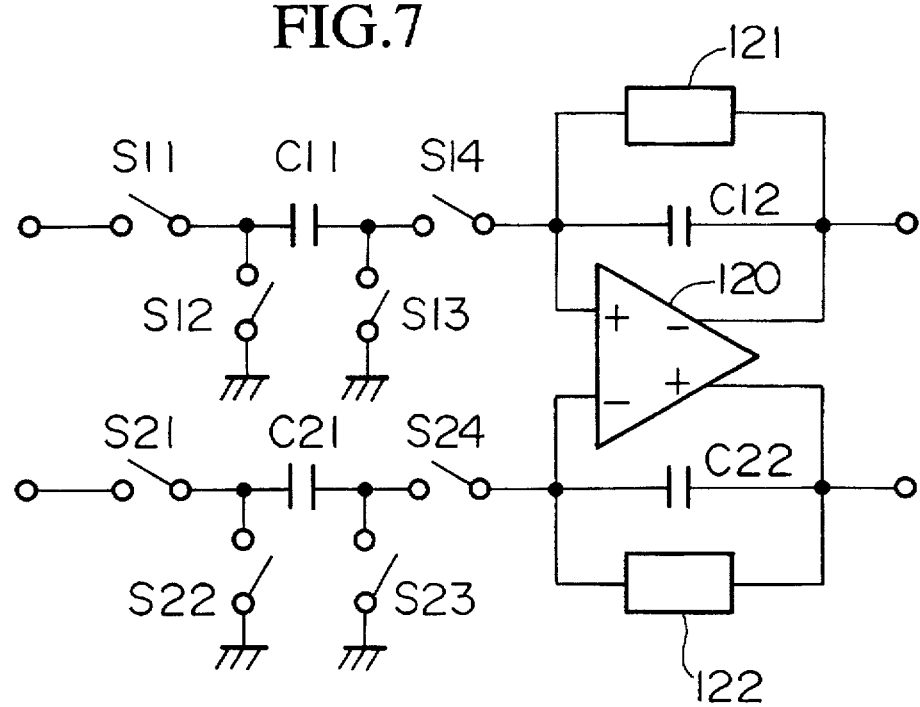
FIG. 7 is a circuit diagram showing configuration of an integrator which is used by the $\Delta \Sigma$ modulator of FIG. 6.

FIG. 7 shows a circuit configuration of a switched-capacitor integrator which is provided as the third-stage integrator 116 in FIG. 6. Herein, a CMOS differential amplifier is configured using a CMOS operational amplifier 120 having an inverting input (−) and a non-inverting input (+). There are provided switch components S11, S12, S13, S14 and capacitors C11, C12 at a side of the non-inverting input; and there are provided switch components S21, S22, S23, S24 and capacitors C21, C22 at a side of the inverting input.

An amplitude-limiting circuit 121 is provided in a feedback circuit for the non-inverting input of the operational amplifier 120, wherein it is connected in parallel with the capacitor C12. Similarly, an amplitude-limiting circuit 122 is provided in a feedback circuit for the inverting input of the operational amplifier 120, wherein it is connected in parallel with the capacitor C22.

Figure 8:
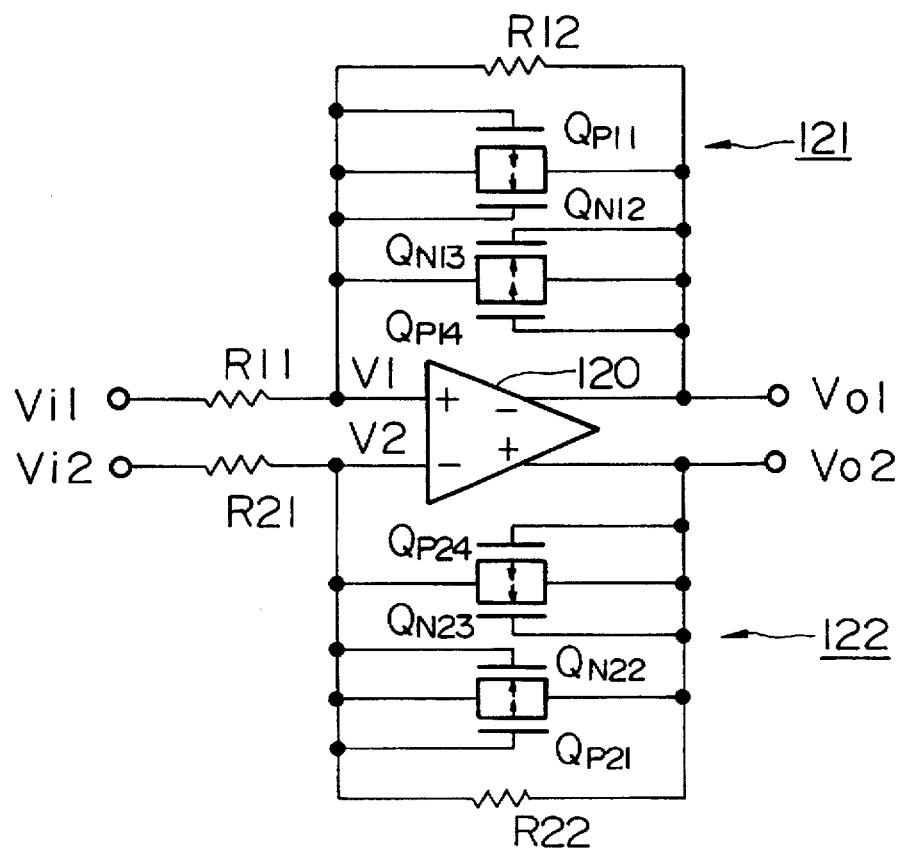
FIG. 8 is a circuit diagram showing configuration of a CMOS differential amplifier which is an essential part of the integrator of FIG. 7.

FIG. 8 shows an example of concrete configuration for the CMOS differential amplifier within the integrator of FIG. 7.

The amplitude-limiting circuit 121 is configured by a pair of PMOS transistors QP11 and QP14 and a pair of NMOS transistors QN12 and QN13, wherein 'PMOS' is an abbreviation for 'P-channel MOS' and 'NMOS' is an abbreviation for 'N-channel MOS'. The PMOS transistors QP11 and QP14 are subjected to diode connection in which their polarities are reversed each other, while the NMOS transistors QN12 and QN13 are subjected to diode connection in which their polarities are reversed each other. Similar to the amplitude-limiting circuit 121, the amplitude-limiting circuit 122 is configured by a pair of PMOS transistors QP21 and QP24 and a pair of NMOS transistors QN22 and QN23, wherein each pair of transistors are subjected to diode connection.

Further, input resistors R11, R21 and feedback resistors R12, R22 are provided to determine gain of the differential amplifier.

A certain 'W/L' ratio, which represents a ratio between gate width 'W' and gate length 'L', is set for each of the transistors, which configure the amplitude-limiting circuits 121 and 122, as shown by Table 1 below.

TABLE 1

|  | W/L |
|---|---|
| QP11, QP21 | 15 |
| QN12, QN22 | 1 |
| QN13, QN23 | 5 |
| QP14, QP24 | 3 |

Next, results of measurement regarding input/output voltage characteristics of the CMOS differential amplifier, which contains the amplitude-limiting circuits 121 and 122, will be described with reference to a graph of FIG. 9 by comparing with comparative examples shown by graphs of FIGS. 10 to 14.

Figure 14:
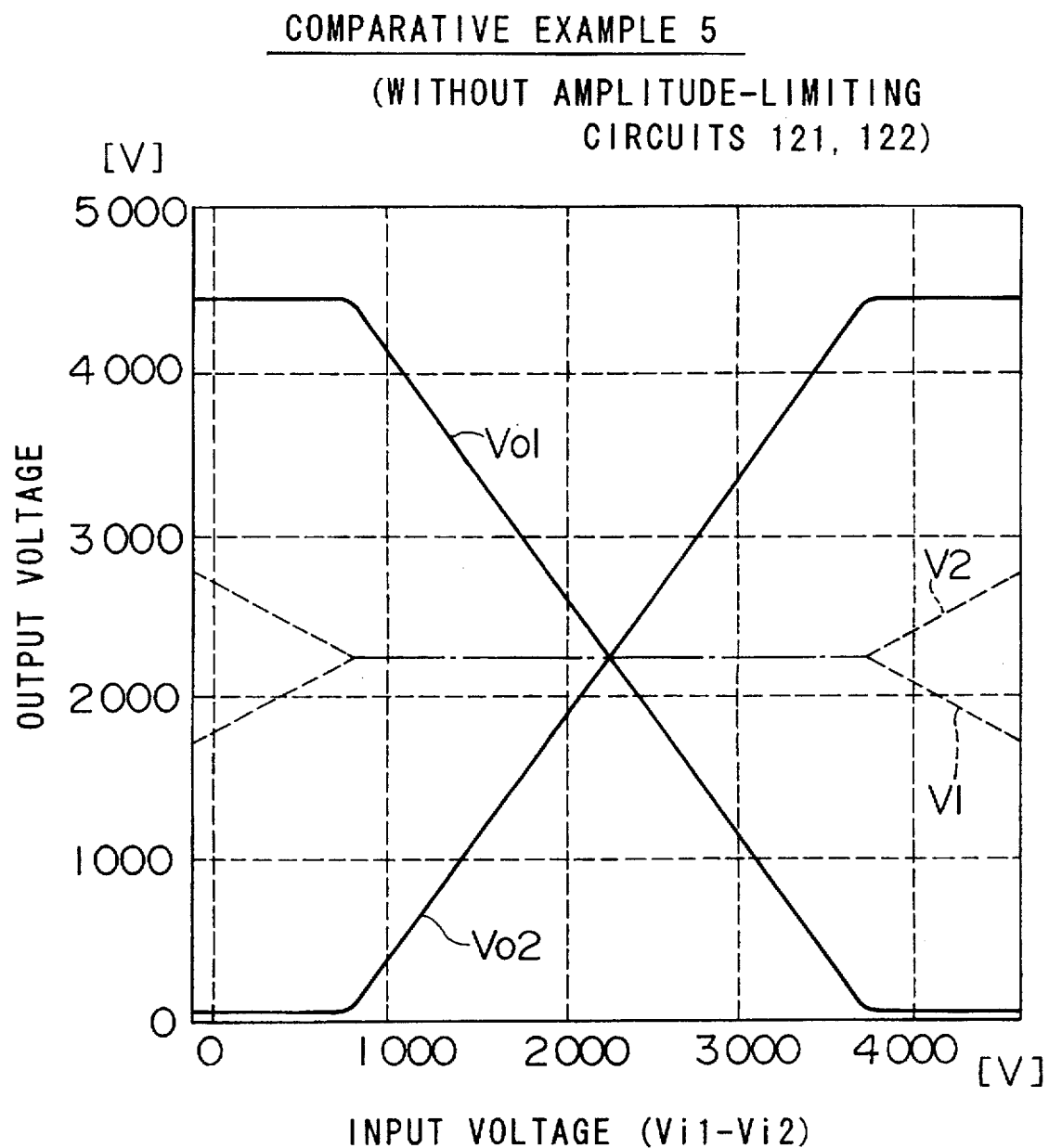
FIG. 14 is a graph showing input/output voltage characteristics of a CMOS differential amplifier according to a comparative example 5.

FIG. 14 shows input/output voltage characteristics regarding "comparative example 5" in which the amplitude-limiting circuits 121 and 122 are removed from the CMOS differential amplifier of FIG. 8. In FIG. 14, as output voltage becomes close to maximum amplitude, non-inverting-input potential 'V1' is separating from inverting-input potential 'V2', so operating point becomes unstable.

Figure 9:
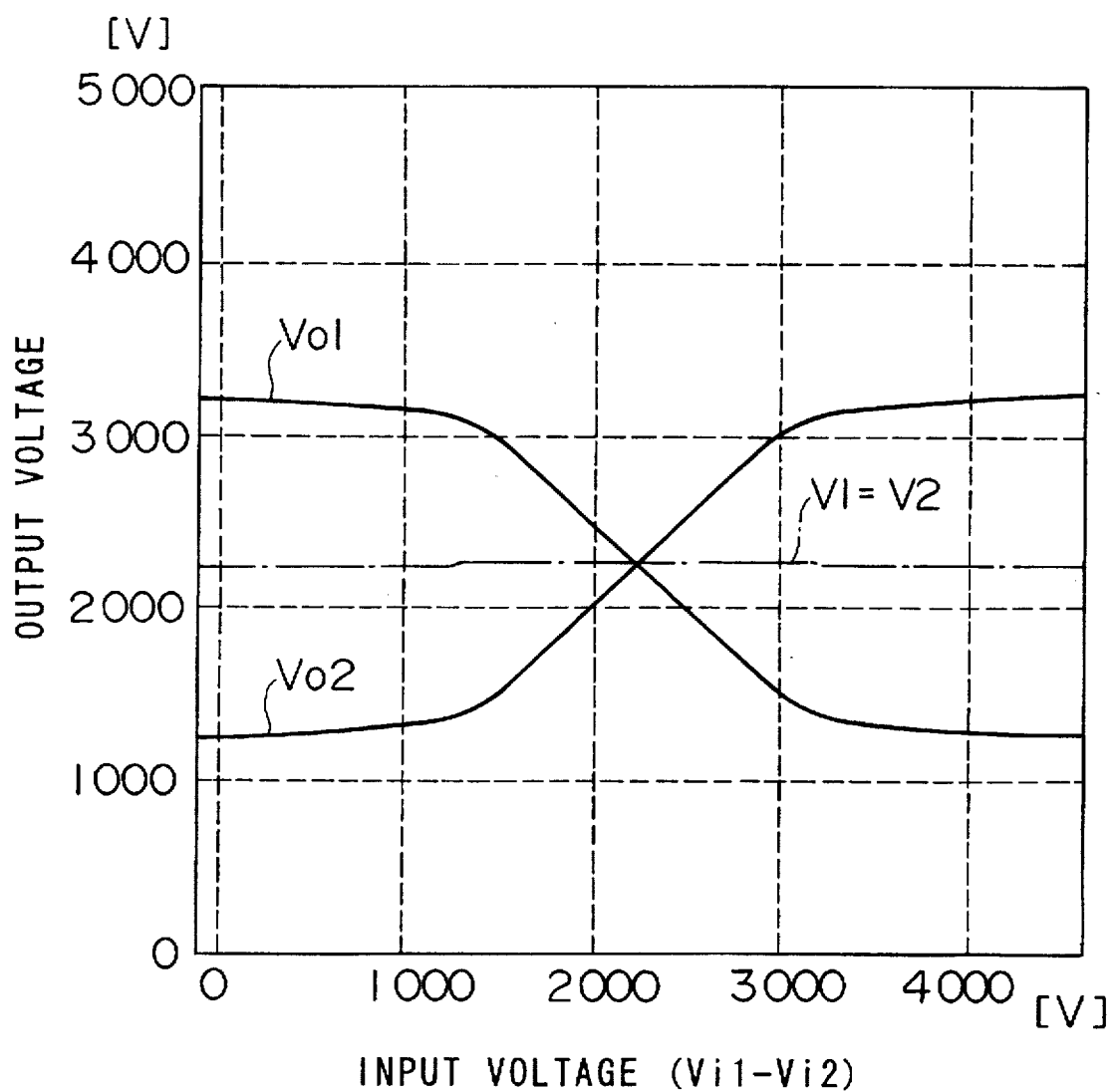
FIG. 9 is a graph showing input/output voltage characteristics of the CMOS differential amplifier according to the present embodiment of FIG. 8.

FIG. 9 shows input/output voltage characteristics regarding "present embodiment" of the CMOS differential amplifier of FIG. 8. In FIG. 9, input potentials V1 and V2 are set equal to each other; and such an 'equal' relationship between the input potentials V1 and V2 is maintained, regardless of variation of input voltage as well as variation of output voltage.

Figure 10:
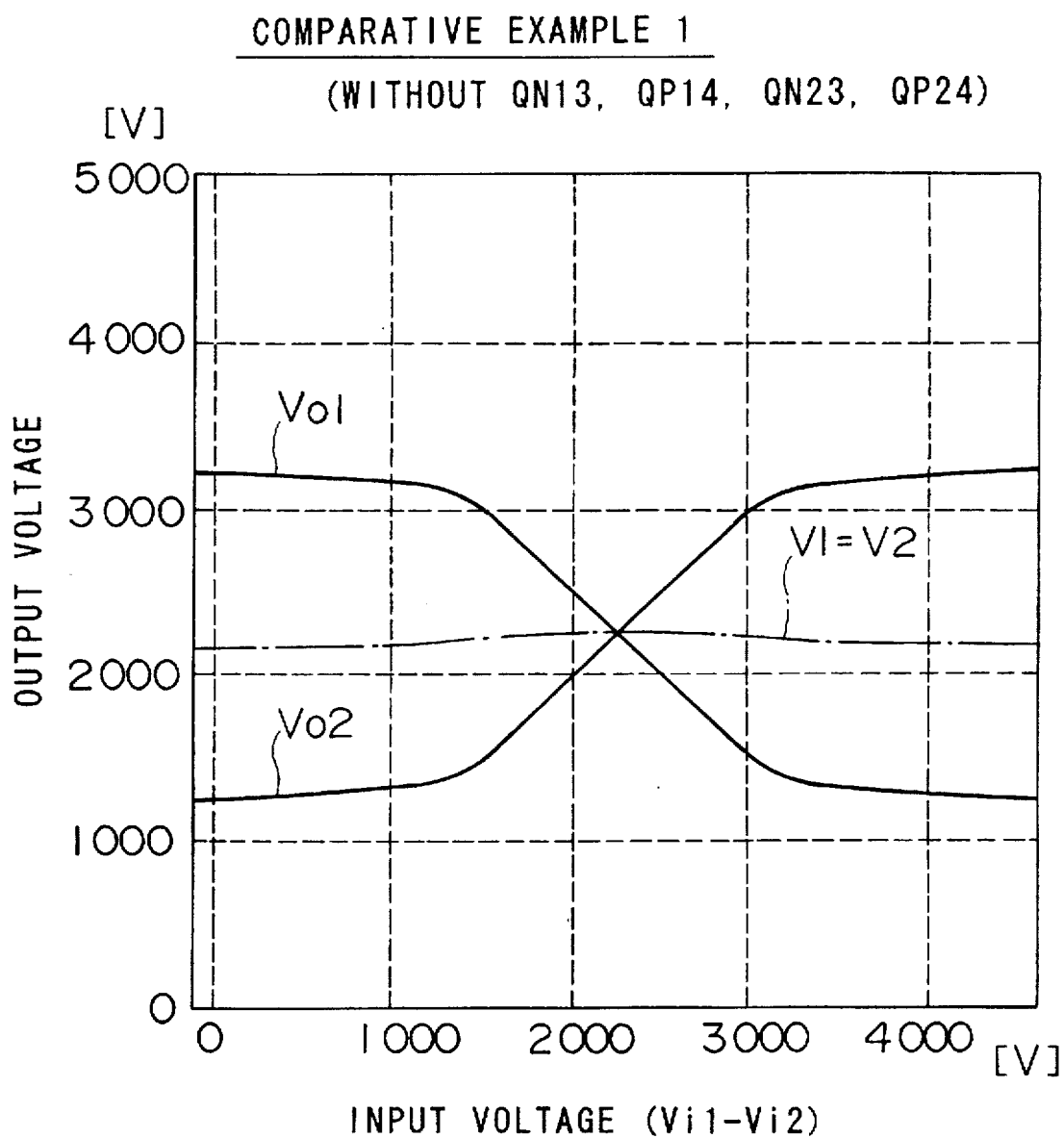
FIG. 10 is a graph showing input/output voltage characteristics of a CMOS differential amplifier according to a comparative example 1.

FIG. 10 shows input/output voltage characteristics regarding "comparative example 1" in which a pair of the NMOS transistor QN13 and the PMOS transistor QP14 are removed from the amplitude-limiting circuit 121 in FIG. 8 while a pair of the NMOS transistor QN23 and the PMOS transistor QP24 are removed from the amplitude-limiting circuit 122 in FIG. 8. In FIG. 10, the equal relationship between the input potentials V1 and V2 is maintained as well. However, as compared to the present embodiment of FIG. 9, a dashed line, representing "V1=V2", is slightly lifted up in a certain range which is around threshold values. This means that as compared to the present embodiment, the comparative example 1 is slightly unstable in operating point.

Figure 11:
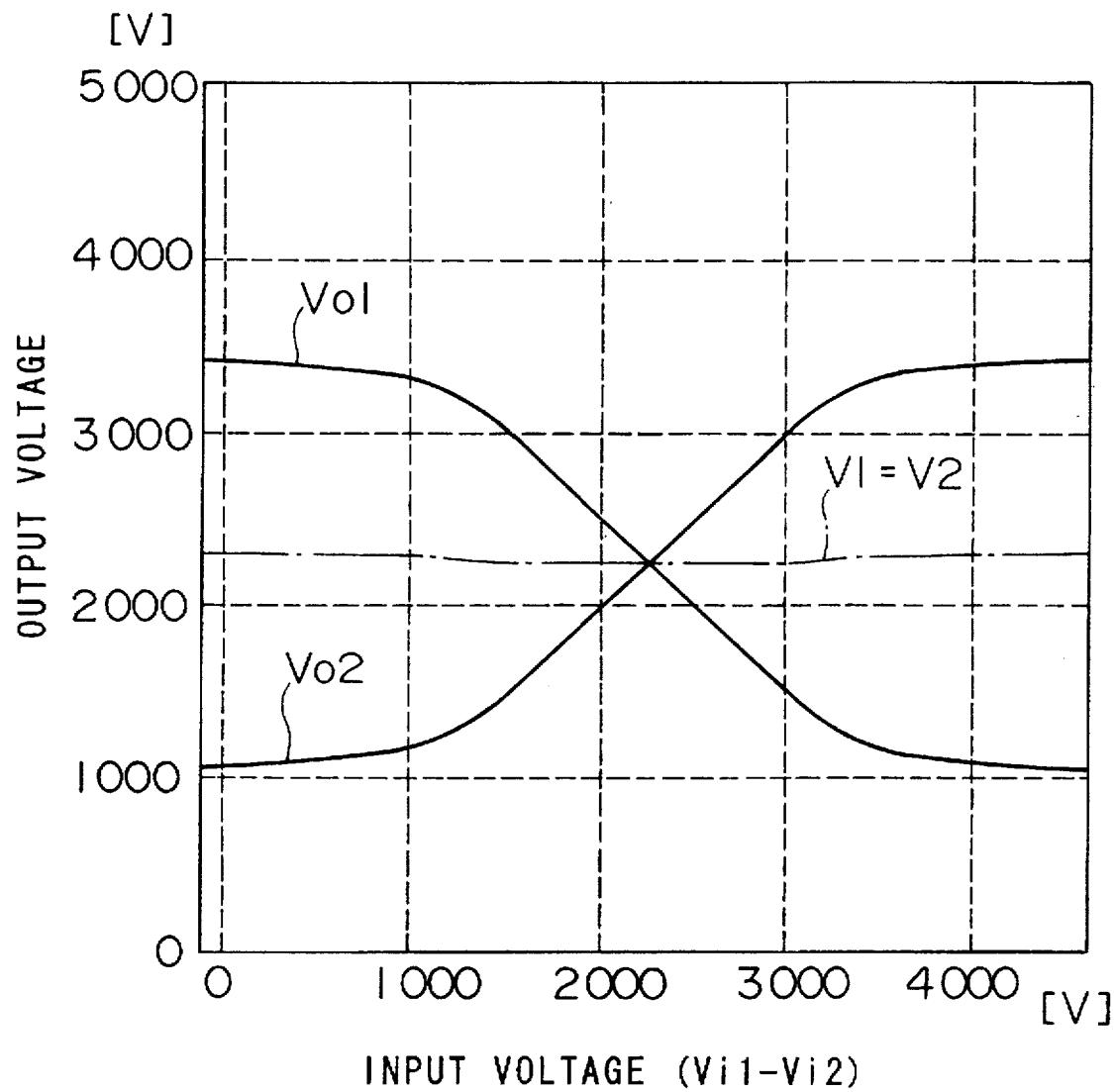
FIG. 11 is a graph showing input/output voltage characteristics of a CMOS differential amplifier according to a comparative example 2.

FIG. 11 shows input/output voltage characteristics regarding "comparative example 2" in which a pair of the PMOS transistor QP11 and the NMOS transistor QN12 are removed from the amplitude-limiting circuit 121 while a pair of the PMOS transistor QP21 and the NMOS transistor QN22 are removed from the amplitude-limiting circuit 122. As compared to the present embodiment of FIG. 9, the comparative example 2 of FIG. 11 is slightly unstable in operating point.

Figure 12:
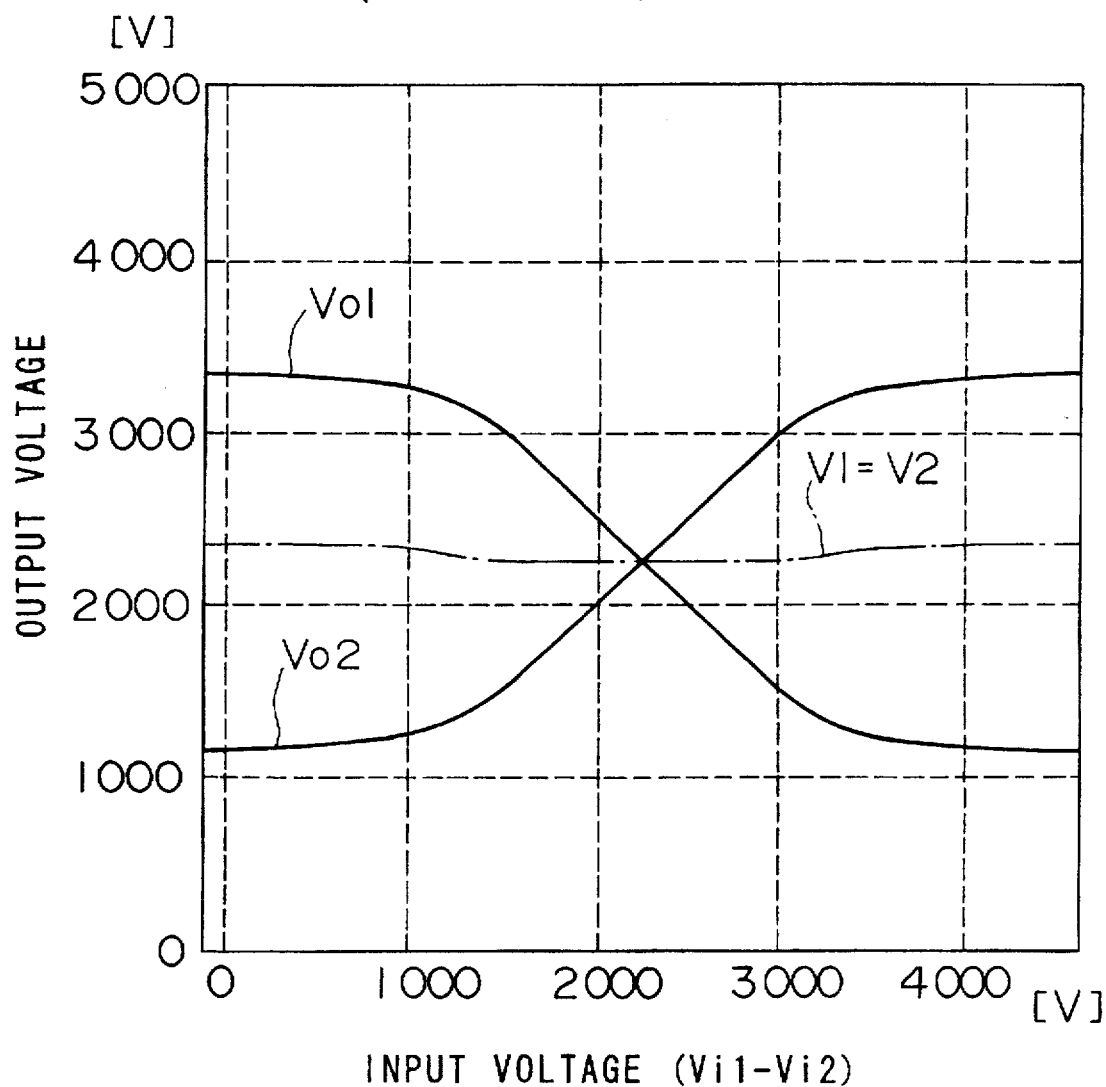
FIG. 12 is a graph showing input/output voltage characteristics of a CMOS differential amplifier according to a comparative example 3.

FIG. 12 shows input/output voltage characteristics regarding "comparative example 3" in which all of the NMOS transistors QN12, QN13, QN22 and QN23 are removed from the differential amplifier of FIG. 8 so that the amplitude-limiting circuits 121 and 122 are configured using the PMOS transistors only.

Figure 13:
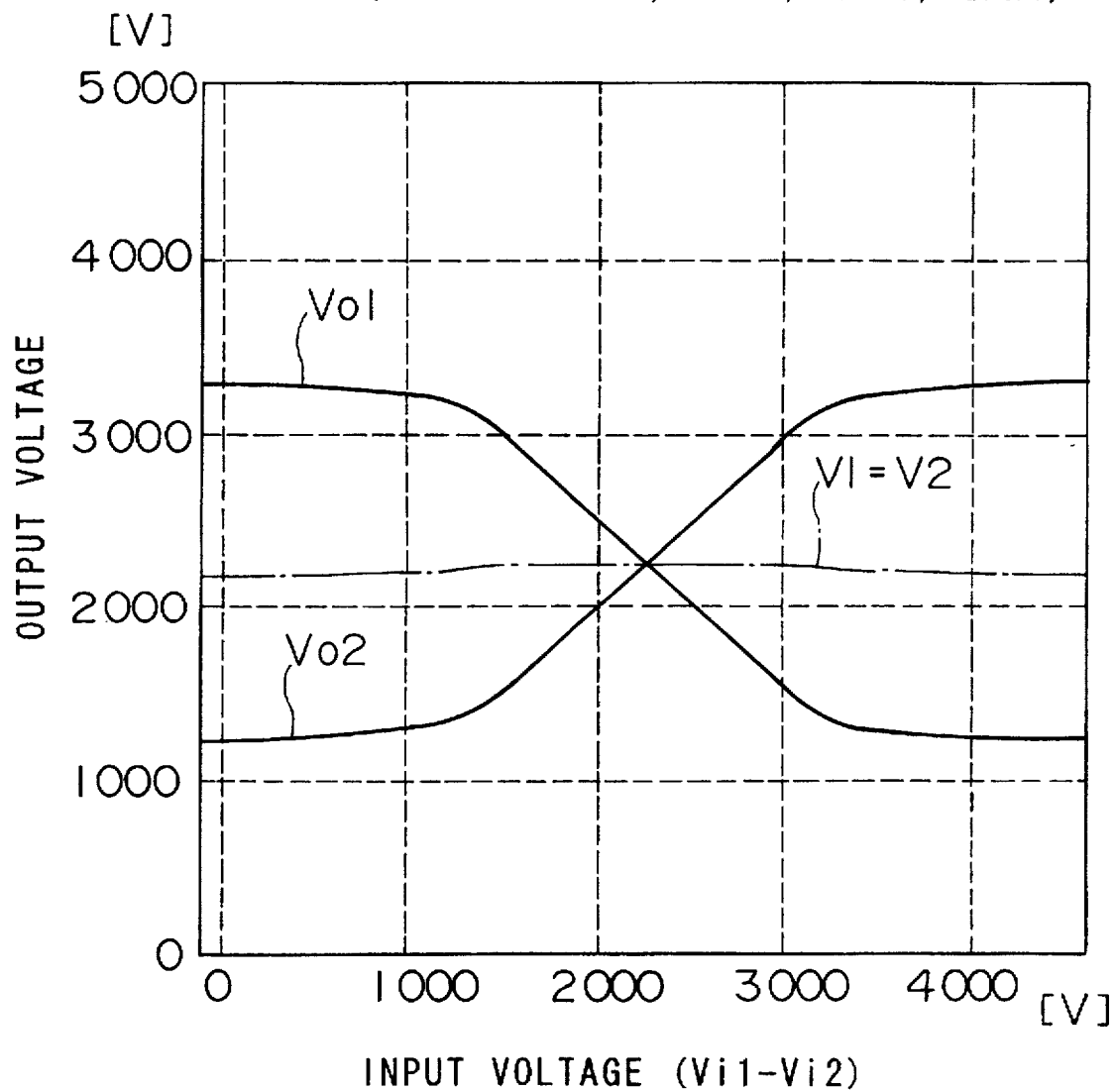
FIG. 13 is a graph showing input/output voltage characteristics of a CMOS differential amplifier according to a comparative example 4.

FIG. 13 shows input/output voltage characteristics regarding "comparative example 4" in which all of the PMOS transistors QP11, QP14, QP21 and QP24 are removed from the differential amplifier of FIG. 8 so that the amplitude-limiting circuits 121 and 122 are configured using the NMOS transistors only.

In each of the above comparative examples of FIGS. 12 and 13, the operating point becomes more unstable.

The above-mentioned facts, which can be realized by comparing the present embodiment of FIG. 9 with the comparative examples of FIGS. 10 to 14, indicate that the CMOS differential amplifier of the present embodiment, in which each of the amplitude-limiting circuits 121 and 122 is configured by combination of two PMOS transistors with two NMOS transistors, is extremely stable against variation in operating point. Herein, optimum measurements are set for the transistors which configure the amplitude-limiting circuits 121 and 122.

When using the CMOS differential amplifier for at least the third-stage switched-capacitor integrator 116, it is possible to certainly avoid occurrence of oscillation in which the conventional Δ Σ modulator is shifted in operating point and shift of the operation point is increased.

As for the third-order Δ Σ modulator, it is effective to use the CMOS differential amplifier of FIG. 8 for at least the third-stage integrator 116. Of course, usage of the CMOS differential amplifier is not limited to the third-stage integrator 116. So, it is possible to use the CMOS differential amplifier for either the first-stage integrator 112 or the second-stage integrator 114 or for both of them.

Effect of the present embodiment may be remarkable when applying the CMOS differential amplifier of FIG. 8 for the Δ Σ modulator of third order or that of higher order. Because, in the Δ Σ modulator of higher order, only a small shift in operating point may be lead to occurrence of oscillation. So, in the Δ Σ modulator of higher order, effect of the present embodiment can be obtained by applying the CMOS differential amplifier to the integrator of third stage or that of higher stage.

Figure 15:
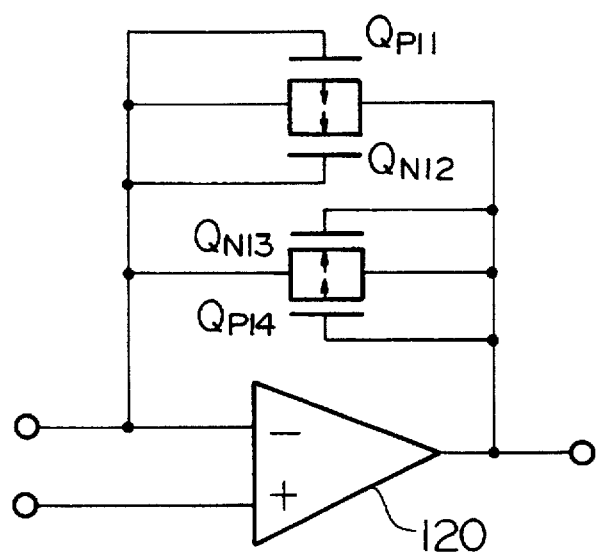
FIG. 15 is a circuit diagram showing another embodiment of a CMOS differential amplifier.
Figure 9:
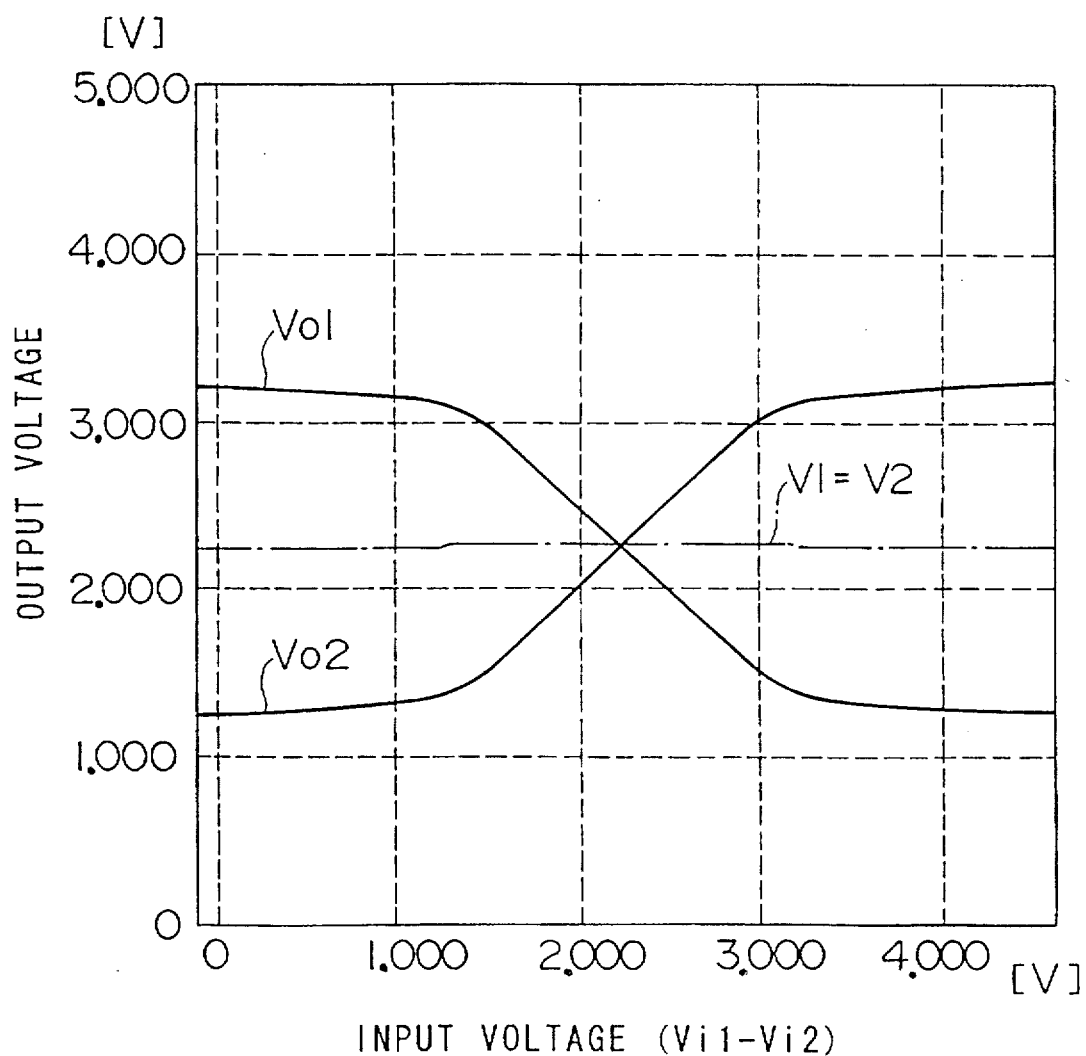
Figure 11:
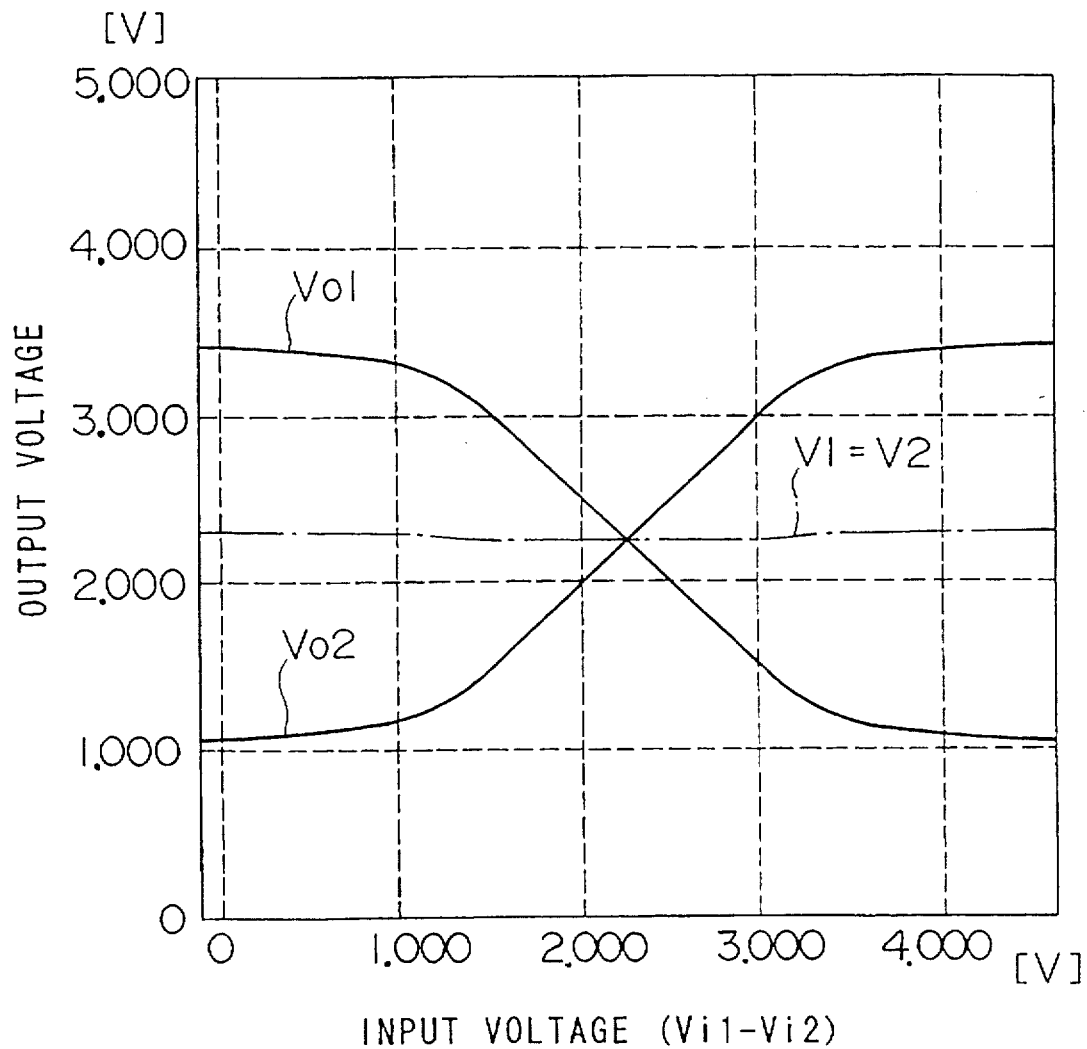
Figure 12:
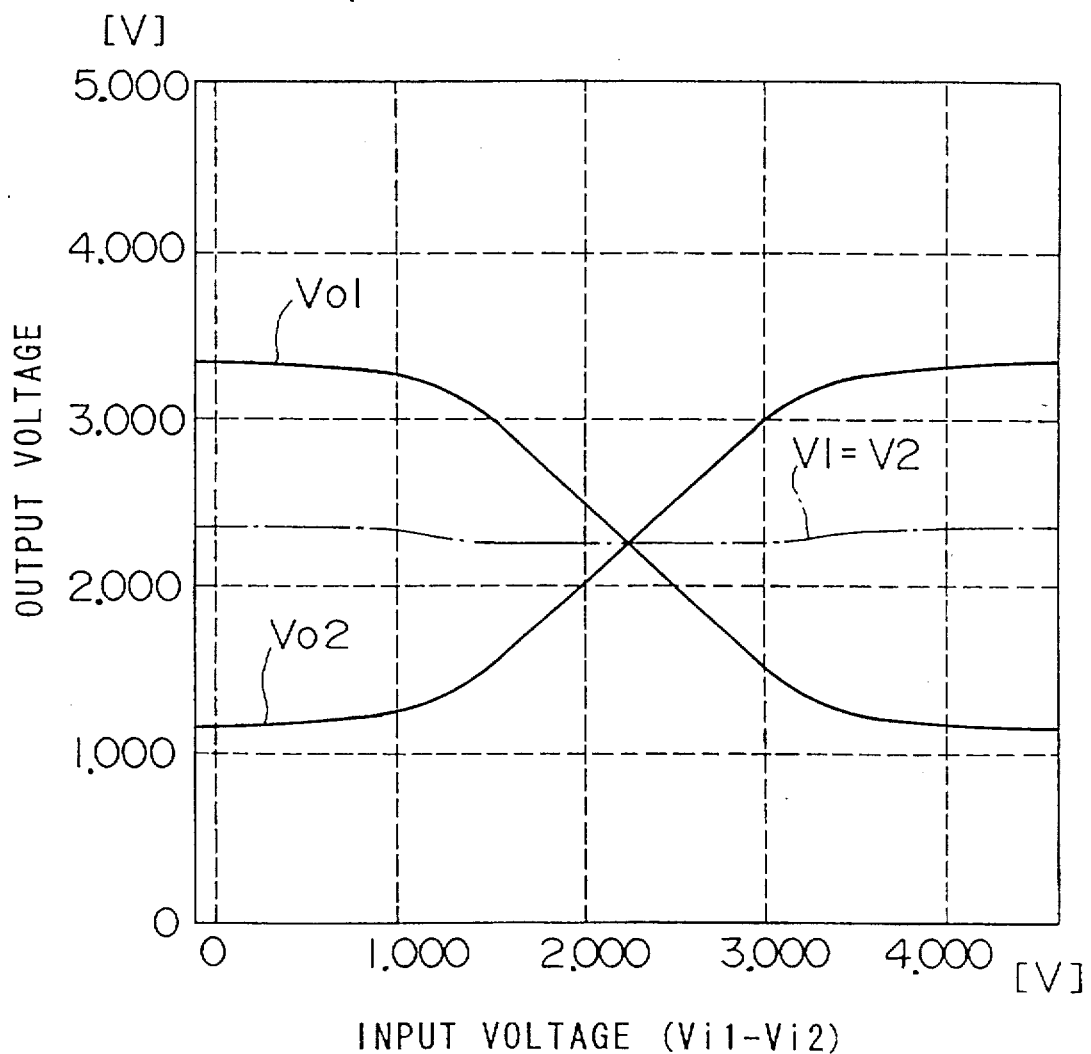

The present embodiment provides the CMOS differential amplifier as a part of the integrator in the Δ Σ modulator. Especially, the present embodiment provides two amplitude-limiting circuits for the differential amplifier. However, instead of the above differential amplifier providing a differential output, it is possible to use a single-end-type CMOS differential amplifier. In that case, the present embodiment can be applied to the single-end-type CMOS differential amplifier as well, which is shown by FIG. 15.

As this invention may be embodied in several forms without departing from the spirit of essential characteristics thereof, the embodiments are therefore illustrative and not restrictive, since the scope of the invention is defined by the appended claims rather than by the description preceeding them, and all changes that fall within meets and bounds of the claims, or equivalence of such meets and bounds are therefore intended to be embraced by the claims.

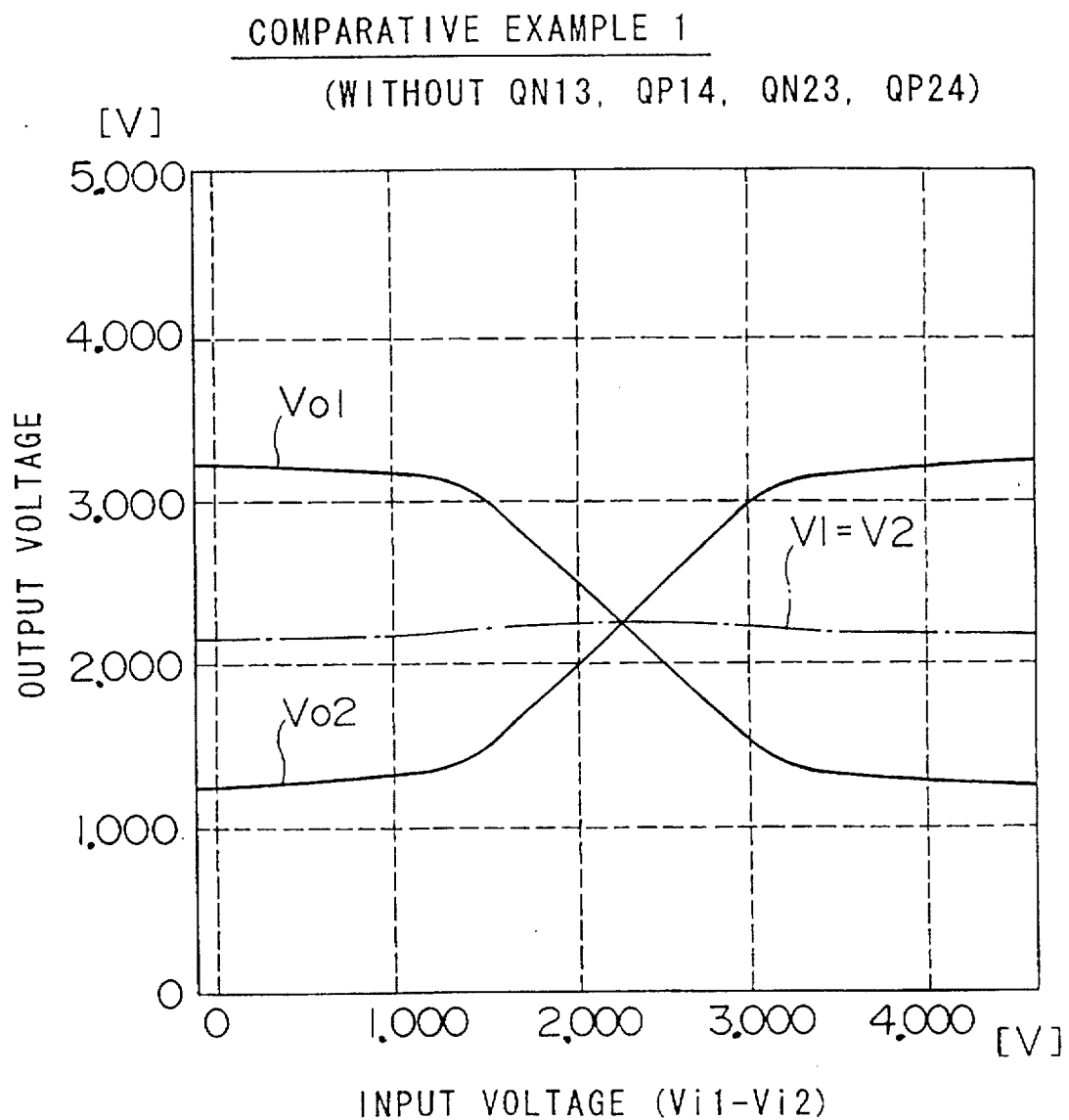

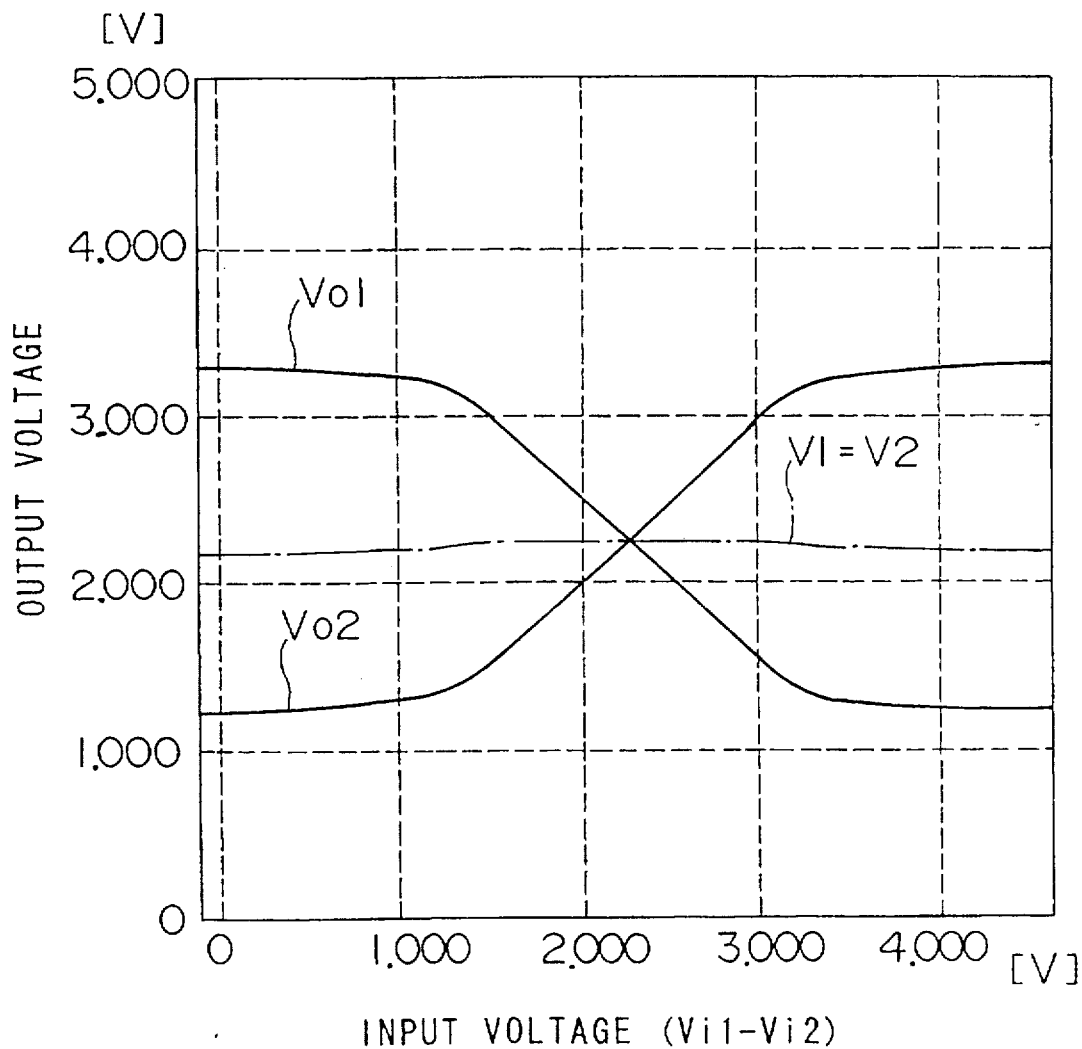

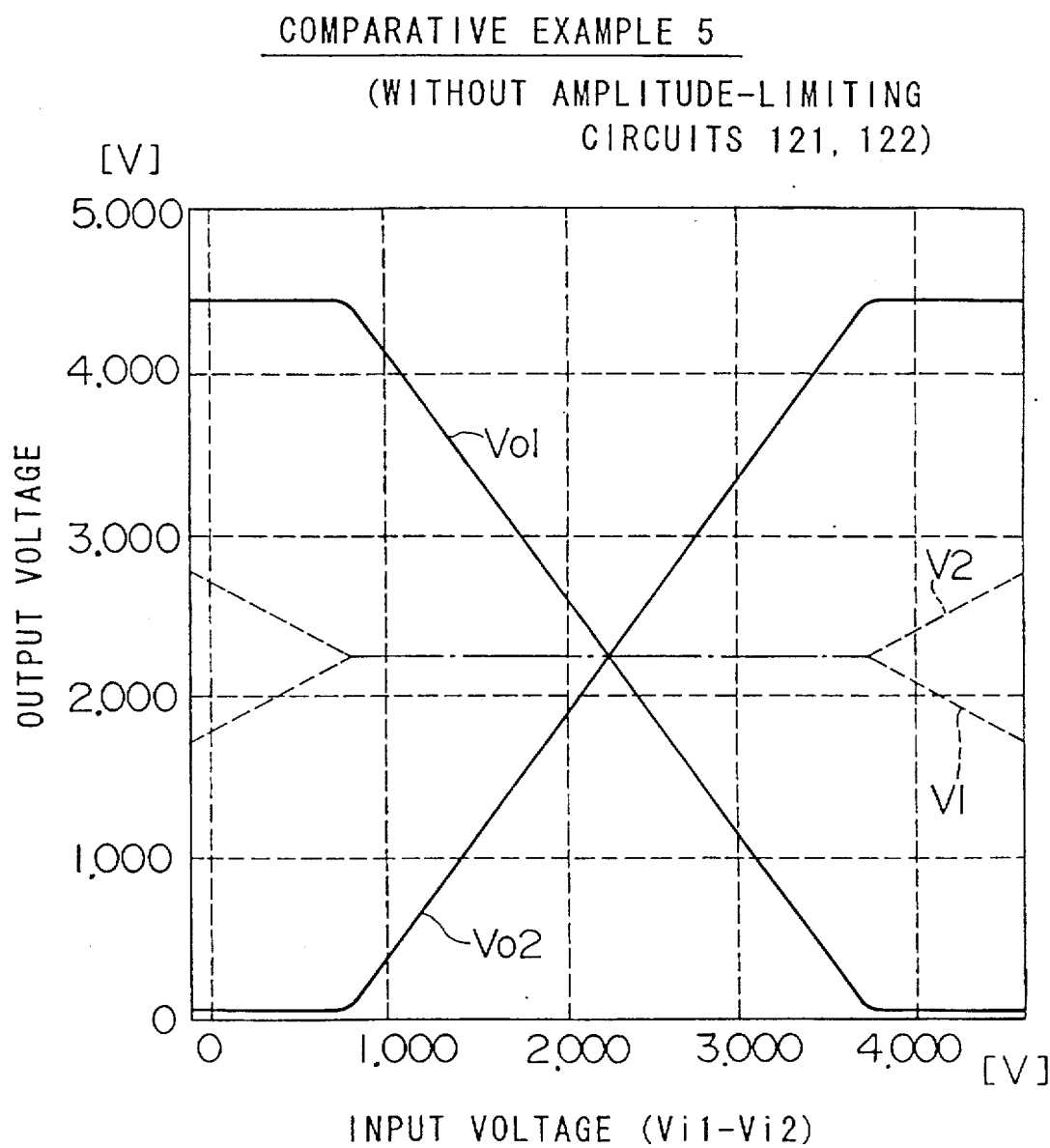

What is claimed is:

1. An analog-to-digital converter comprising:

a Δ Σ modulator for converting analog input into serial-bit digital data, wherein gain of the Δ Σ modulator is set at '1/A' and 'A' is an arbitrary value greater than one;

a digital filter for extracting low-frequency components, corresponding to the analog input, from the serial-bit digital data which are outputted from the Δ Σ modulator and for converting the low-frequency components into parallel-bit digital data;

a high-pass filter for receiving output of the digital filter so as to remove a DC offset component of the analog input from the output of the digital filter; and multiplier means for multiplying output of the high-pass filter by 'A'.

2. An analog-to-digital converter according to claim 1 wherein 'A' is set at '2'.

3. An analog-to-digital converter according to claim 1 wherein the digital filter is a low-pass filter.

4. An analog-to-digital converter according to claim 1 wherein the Δ Σ modulator comprises a switched-capacitor integrator, a one-bit quantizer coupled to the integrator, and a feedback circuit coupled to the quantizer and the integrator, wherein the switched-capacitor integrator integrates the analog input, the one-bit quantizer receives the output of the integrator and provides a delay equal to one sample period, and the feedback circuit receives the output of the quantizer and inputs the quantizer output to the switched-capacitor.

5. A Δ Σ modulator comprising:

at least three switched-capacitor integrators which are connected in series, wherein an analog input is applied to a first switched-capacitor integrator;

a one-bit quantizer for quantizing output of a last switched-capacitor integrator so as to produce one-bit digital output; and a one-sample delay circuit for providing a delay equal to one sample period to the output of the one-bit quantizer, wherein the output of the delay circuit is provided to each of the at least three switched-capacitor integrators, wherein at least one switched-capacitor integrator comprises a CMOS differential amplifier which includes a CMOS operational amplifier and at least one amplitude-limiting circuit, wherein the amplitude-limiting circuit is connected between an input terminal and an output terminal of the CMOS operational amplifier, and wherein the amplitude-limiting circuit limits amplitude of the output of the CMOS differential amplifier by stabilizing an operating point of the CMOS differential amplifier.

6. A Δ Σ modulator according to claim 5 wherein each switched capacitor integrator further comprises an adder and an integrator, wherein the adder subtracts the output of the one-sample delay circuit from the input thereof and the output of the adder is provided to the integrator.

7. A Δ Σ modulator according to claim 5 wherein the at least one amplitude-limiting circuit comprises first and second PMOS transistors and first and second NMOS transistors, wherein the first PMOS transistor and the first NMOS transistor are connected in parallel to the second PMOS transistor and the second NMOS transistor, wherein the polarity of the first PMOS transistor and the second NMOS transistor are equal and reversed as compared to the polarity of the second PMOS transistor and the first NMOS transistor.

* * * * *

UNITED STATES PATENT AND TRADEMARK OFFICE
CERTIFICATE OF CORRECTION

PATENT NO.   : 5,757,299
DATED        : May 26, 1998
INVENTOR(S)  : Masao NORO, et al It is certified that error appears in the above-identified patent and that said Letters Patent is hereby corrected as shown below:

IN THE TITLE:

The title is changed to read:

--ANALOG-TO-DIGITAL CONVERTER USING DELTA SIGMA MODULATION, DIGITAL FILTERING, AND GAIN-SCALING--

IN THE DRAWINGS:

The drawing sheets, 7-12, should be deleted to be replaced with drawing sheets 7-12, consisting of Figs. 9-14, as shown on the attached pages.

Signed and Sealed this

Twenty-third Day of November, 1999

Attest:

Q. TODD DICKINSON

*Attesting Officer*   *Acting Commissioner of Patents and Trademarks*